United States Patent [19]
Nordeen et al.

[11] Patent Number: 6,022,440
[45] Date of Patent: Feb. 8, 2000

[54] IMAGE TRANSFER PROCESS FOR INK-JET GENERATED IMAGES

[75] Inventors: Charles Kevin Nordeen, Saint Paul; Donald Lawrence Knutson, Birchwood, both of Minn.

[73] Assignee: Imation Corp., Oakdale, Minn.

[21] Appl. No.: 08/987,885

[22] Filed: Dec. 8, 1997

[51] Int. Cl.[7] .......................... B44C 1/165; B32B 31/00
[52] U.S. Cl. .................. 156/241; 156/247; 156/277; 156/289; 156/230; 156/240
[58] Field of Search ........................... 156/230, 231, 156/234, 237, 238, 239, 240, 241, 247, 277, 289

[56] References Cited

U.S. PATENT DOCUMENTS

| | | |
|---|---|---|
| 2,528,395 | 10/1950 | Slifkin . |
| 3,013,917 | 12/1961 | Karlan et al. . |
| 3,721,557 | 3/1973 | Inoue . |
| 3,987,225 | 10/1976 | Reed et al. . |
| 4,111,734 | 9/1978 | Rosenfeld . |
| 4,251,611 | 2/1981 | Mehl et al. . |
| 4,376,158 | 3/1983 | Spechler . |
| 4,376,159 | 3/1983 | Spechler . |
| 4,383,878 | 5/1983 | Young et al. . |
| 4,454,179 | 6/1984 | Bennett et al. . |
| 4,482,625 | 11/1984 | Namiki et al. . |
| 4,521,785 | 6/1985 | Matsufuji . |
| 4,686,163 | 8/1987 | Ng et al. . |
| 4,719,169 | 1/1988 | Platzer . |
| 4,756,963 | 7/1988 | Yamamoto et al. . |
| 4,766,053 | 8/1988 | Shinozaki et al. . |
| 4,780,348 | 10/1988 | Yamamato et al. . |
| 4,902,594 | 2/1990 | Platzer . |
| 4,902,669 | 2/1990 | Matsuda et al. . |
| 4,923,848 | 5/1990 | Akada et al. . |
| 4,999,076 | 3/1991 | Incremona et al. . |
| 5,055,444 | 10/1991 | Kaszcuk . |
| 5,077,263 | 12/1991 | Henzel . |
| 5,094,931 | 3/1992 | Platzer . |
| 5,192,630 | 3/1993 | Platzer . |
| 5,258,247 | 11/1993 | Platzer . |
| 5,342,688 | 8/1994 | Kitchin et al. . |
| 5,372,985 | 12/1994 | Chang et al. . |
| 5,372,987 | 12/1994 | Fisch et al. . |
| 5,389,723 | 2/1995 | Iqbal et al. . |
| 5,397,634 | 3/1995 | Cahill et al. . |
| 5,472,789 | 12/1995 | Iqbal et al. . |
| 5,529,883 | 6/1996 | Platzer et al. . |
| 5,589,269 | 12/1996 | Ali et al. . |
| 5,593,808 | 1/1997 | Ellis ........................................ 430/261 |
| 5,622,795 | 4/1997 | Ellis .......................................... 430/14 |
| 5,633,116 | 5/1997 | Kapusniak et al. . |
| 5,665,505 | 9/1997 | Malhotra . |
| 5,672,413 | 9/1997 | Taylor et al. . |
| 5,766,398 | 6/1998 | Cahill et al. . |
| 5,773,188 | 6/1998 | Ellis ........................................ 430/201 |
| 5,795,425 | 8/1998 | Brault et al. . |

FOREIGN PATENT DOCUMENTS 959670  6/1964  United Kingdom .

OTHER PUBLICATIONS

Color: Theory and Imaging Systems, copyright 1973, Society of Photographic Scientists and Engineers, *Color–In–Color*, authors Dr. Douglas H. Dybvig, Dr. Thomas J. Evensen, Mr. John W. Ulseth, Mr. Joseph A. Wiese.

*Primary Examiner*—Richard Crispino
*Assistant Examiner*—J. A. Lorengo

[57] ABSTRACT

An image transfer process is provided for transferring an ink-jet image composite from an original receptor to a final receptor. The transfer process allows one to view an ink-jet image on a variety of substrates including mock-ups for packaging and other materials that would not be capable of receiving an image directly in an ink-jet printer.

5 Claims, No Drawings

IMAGE TRANSFER PROCESS FOR INK-JET GENERATED IMAGES

FIELD OF THE INVENTION

The present invention relates to an image transfer process for transferring an ink-jet image composite from an original receptor to a final receptor.

BACKGROUND

The ability to transfer a color proof composite to any media provides a convenient means for one to view a simulated color print prior to investing in the expense and labor of printing a job on a printing press. It also provides an inexpensive means for constructing mock-up samples where only a few samples are needed. This is particularly useful in designing imaged package materials. For example, several mock-up samples with slight variations can be constructed for comparative studies to evaluate general marketing impact and appeal. Many approaches have been disclosed in the art using different methods in combination with different imaging technologies.

For example, image transfer systems using conventional color proofing materials based on colored photoresists are described in U.S. Pat. Nos. 3,721,557; 4,376,158; 4,376,159; 4,482,625; 4,766,053; 5,094,931; and 5,192,630. In a colored photoresist system, an image is formed by exposing a photosensitive layer to actinic radiation and then developed with a liquid developer. The developing solution may be solvent based or aqueous based depending upon the formulation of the photoresist. The developer is used to wash away the non-imaged areas and then disposed of either immediately or after reuse to exhaustion by discharging into a drain or sending to a waste disposal site.

U.S. Pat. No. 2,528,395 describes an image transfer system where a diazo-type photosensitive coating is applied to a substrate having a pressure-sensitive adhesive attached to the backside of the substrate. The material is exposed and developed with ammonia fumes. The imaged film is then transferred to any substrate via the pressure-sensitive adhesive. Other transfer systems using pressure sensitive adhesive are also known e.g., U.S. Pat. Nos. 3,987,225 and 4,111,734. The use of pressure sensitive adhesives has several disadvantages such as lack of dimensional stability, the image is easily scratched or torn, and the surface of the composite is easily disrupted by objects lying on the surface.

Image transfer systems using liquid and dry electrophotographic and electrostatic generated images are also known. Representative examples of these types of transfer system may be found in U.S. Pat. Nos. 4,383,878; 4,686,163;

More recently, transfer systems and materials using dye, mass transfer, and ablative transfer films in laser or thermal head printers have grown in popularity. Examples of these types of transfer systems may be found in U.S. Pat. Nos. 4,902,669; 4,923,848; 5,055,444; 5,077,263; 5,372,987; and 5,633,116. In each of these systems, the non-imaged portions of the donor element retain non-transferred material which makes it difficult to recycle the spent carrier film.

None of the aforementioned image transfer systems provide ideal systems with regard to environmental disposal or efficient use of materials. Some of the systems require liquid developers which are either discharged directly into a drain or sent to a waste disposal site. The Electrophographic systems use liquid toners based on organic solvents which raise concerns for emissions of volatile organic compounds thus requiring means for recovering the solvent and disposal. Dry toner systems use toner powders which become air borne and inhaled. The diazo-type materials require the use of ammonia fumes which have a repugnant smell and are difficult to contain. Therefore, there is a need for an image transfer system that minimizes disposal of unused materials, reduces emissions of volatile organic compounds and provides recyclable spent materials.

SUMMARY OF THE INVENTION

The present invention provides an image transfer method for transferring images generated by ink-jet inks to a variety of substrates. The transfer process includes the steps of: (1) forming an image composite by applying at least one ink-jet ink in an imagewise pattern(s) on a first receptor comprising a temporary support having deposited thereon an ink receptive layer; (2) providing a second receptor comprising a final substrate having deposited thereon an adhesive layer; (3) laminating the imaged side of the image composite with heat and pressure to the adhesive layer of the second receptor; and (4) removing the temporary support. The removed temporary support is essentially free of unused coating material and is therefore more easily recycled. In a preferred embodiment, the first receptor comprises a releasable thermoplastic layer interposed between the temporary support and the ink receptive layer.

In another embodiment, a second imaged composite is laminated onto the transferred image composite on the second receptor described above.

In yet another embodiment, a multi-colored image composite is provided comprising in order a final substrate, an adhesive layer, a multi-colored ink-jet image deposited on or absorbed in an ink receptive layer, and an optional thermoplastic layer.

In yet another embodiment, a method of forming an image is provided including the steps of (a) coating an ink-receptive layer onto a temporary support; (b) providing a receptor comprising a final substrate having deposited thereon an adhesive layer; (c) laminating the ink-receptive layer with heat and pressure to the adhesive layer of the second receptor; (d) removing the temporary support, and (d) forming an image by applying at least one ink-jet ink in an imagewise pattern(s) onto the ink-receptive layer. A second adhesive layer may be transferred onto the imaged composite by laminating a second receptor comprising a releasable support having deposited thereon the second adhesive to the imaged ink-receptive layer. The releasable support is then removed thus providing a protective layer overlying the image.

As used herein, the terms "mordant" refers to a compound which, when present in a composition, interacts with a dye to prevent diffusion though the composition;

"semi-interpenetrating network" or "SIPN" refers to an entanglement of a homocrosslinked polymer with a linear uncrosslinked polymer:

"crosslinkable" refers to the capability of forming covalent or strong ionic bonds with itself or with a separate agent added for this purpose;

"hydrophilic" describes materials that are generally receptive to water, either in the sense that its surface is wettable by water or in the sense that the bulk of the material is able to absorb significant quantities of water; and "hydrophobic" refers to materials which are not readily wettable by water.

DETAILED DESCRIPTION OF THE INVENTION

The transfer system of the present invention allows one to transfer an ink-jet image from an original receptor to a variety of substrates. Initially, an image is formed in an ink-jet printer using ink-jet inks, preferably aqueous inks. The image is printed onto an ink receptive layer which is releaseably attached to a temporary support. To achieve a right reading image after transfer, a reverse image (i.e. mirror image of the final image) is printed onto the ink receptive layer. Any standard ink that is designed for ink-jet printers may be used. To reduce volatile organic compound (VOCs) emissions, aqueous inks are preferred. Generally, at least four different colored inks are provided, i.e., yellow, magenta, cyan and black. However, additional colors and color enhancement inks may also be used. For example, phosphorescent and fluorescent inks, pearlescent inks, secondary color inks (i.e., Pantone™, colors.), varnishes, and metallic inks may be used. Suitable commercial inks for color proofing applications include Imation™ Cyan. Magenta, Yellow and Black Writing Fluids (available from Imation™ Corp. Oakdale, Minn.) and Iris™ Graphics inks (available from Iris Graphics, Bedford, Mass.). Other commercial ink-jet inks generally known in the art may also be used.

The receptor comprises a temporary support having deposited thereon an ink receptive layer. The support may be any flexible film forming material. Suitable support materials include filled and unfilled polyester, cellulose acetate, polycarbonate, polyethylene, polypropylene, etc. Coated papers or paper laminates may also be used. The support may have a roughened surface which imparts a deglossed surface to the transferred image composite after transfer to a final receptor. The thickness of the support is typically between 50 and 125 micrometers. Supports having a caliper less than 50 micrometers are difficult to handle and supports having calipers greater than 125 micrometers may present feeding difficulties in certain commercially available ink jet printers and pen plotters.

An ink receptive layer is releasably attached to the support surface. Any known ink-receptive polymer may be used in the ink-receptive layer. Preferably the ink-receptive layer includes a polymeric blend of at least one water-absorbing hydrophilic, polymeric material and at least one hydrophobic polymeric material having acid functional groups. Suitable water-absorbing hydrophilic polymeric materials include homopolymers or copolymers of monomers selected from vinyl lactams, alkyl tertiary amino alkyl (meth)acrylates, alkyl quaternary amino alkyl (meth) acrylates, 2-vinylpyridine and 4-vinylpyridine. Generally, the polymers are made through a free-radical polymerization process. The appropriate time, temperature and monomer ratios are selected to achieve the desired properties of the final polymer which is well known to those skilled in the art.

The hydrophobic polymeric materials are typically derived from combinations of acrylic or other hydrophobic ethylenically unsaturated monomers copolymerized with monomers having acid functionality. Preferably the hydrophobic monomers form water-insoluble polymers when polymerized alone, and contain no pendant alkyl groups having more than 10 carbon atoms. Suitable hydrophobic monomers include alkyl (meth)acrylate, acrylonitrile, styrene or α-methylstyrene, and vinyl acetate. Preferably, 2% to 20% of the copolymer is composed of acid functional monomers such as (meth)acrylic acids.

A polyethylene glycol may also be added to reduce curl. Lower molecular weight polyethylene glycols are more effective for reducing curl while maintaining a low level of haze; therefore, the polyethylene glycol preferably has a molecular weight of less than 4,000.

A preferred ink receptive composition is described in U.S. Pat. Nos. 5,389,723 and 5,472,789, incorporated herein by reference. The ink receptive composition comprises a crosslinked semi-interpenetrating network (SIPN) formed from a blend of at least one polymeric matrix component, at least one liquid-absorbent polymer and an optional crosslinking agent. The crosslinkable polymers are either hydrophobic or hydrophilic in nature, and can be derived from either the copolymerization of acrylic or other hydrophobic or hydrophilic ethylenically unsaturated monomers with monomers having acidic groups, or by hydrolysis of any pendant ester groups present in the acrylic or ethylenically unsaturated monomer.

Hydrophobic monomers form polymers that form water-insoluble polymers which are capable of absorbing only small amounts of water when polymerized by themselves. Preferred hydrophobic monomers include (meth)acrylates, (meth)acrylonitriles, substituted or unsubstituted styrenes or α-methylstyrenes, and vinyl acetates. Preferred hydrophilic monomers include vinyl lactams, (meth)acrylamides, tertiary amino alkyl(meth)acrylates, hydroxy alkyl(meth) acrylates or alkoxy alkyl(meth)acrylates. The crosslinking agent is preferably a polyfunctional aziridine such as trimethylol propane-tris-($\beta$-(N-aziridinyl)propionate, pentaerythritol-tris-($\beta$-(-aziridinyl )propionate, or trimethylolpropane-tris-($\beta$-(N-methylaziridinyl) propionate). Crosslinking may alternatively be achieved by means of metal ions, such as multivalent metal ion salts, provided that a chelating compound is present in the composition. Suitable chelating compounds include alkaline metal salts of (meth)acrylic acid, N-substituted (meth) acrylamido monomers containing ionic groups, alkali metal salts of p-styrene sulfonic acid, sodium salt of 2-sulfo ethyl (meth)acrylate, 2-vinyl pyridine or 4-vinyl pyridine, vinyl imidazole, N-(3-aminopropyl) methacrylamide hydrochloride, and 2-acetoacetoxy ethyl (meth)acrylates.

Other crosslinkable polymers suitable for the matrix component of the hydrophilic SIPNs are polymers having crosslinkable tertiary amino groups, where the groups can be provided either as part of the monomer used in the formation of the polymer, or grafted onto the polymer after the formation of the polymeric backbone. A particularly useful example of a crosslinkable matrix component is derived from the reaction of a polymer having crosslinkable tertiary amino groups with a copolymer of equimolar amounts of polymethyl vinyl ether and maleic anhydride. Suitable crosslinking agents for this type of polymer are multi-functional alkylating agents. The functional groups form a bond with a polymer chain through a tertiary amino group by quaternization of the trivalent nitrogen of the tertiary amino group.

Additional crosslinkable polymers suitable for forming the matrix component of the SIPNs include polymers having silanol groups, where the silanol groups can either be part of the monomers used in the formation of the polymer or be grafted onto the polymer after the formation of the polymeric backbone. The polymer can be crosslinked by the removal of water and other solvents from the system without addition of further crosslinking agents.

Other suitable crosslinkable polymers for the formation of the matrix component of the SIPNs include polymers bearing groups capable of preventing gelation of a coating solution containing the crosslinkable polymer and the liquid-absorbent polymer after the crosslinkable polymer is crosslinked in solution but before the solution is coated onto a substrate and dried. These polymers generally contain maleic anhydride units, which function as sites for grafting of the gelation-preventing groups. The gelation-preventing groups are monofunctional oligomers that not only react with the maleic anhydride units of the polymer but are also highly soluble in the coating solvent. Typical oligomeric materials include monofunctional polyoxy alkyleneamines such as the Jeffamine™ series of oligomers having a molecular weight between 200 and 3,000 manufactured by Texaco Chemical Company.

Unlike the crosslinkable component of the SIPN, the primary function of the liquid-absorbent component is to promote absorption of the liquid inks. Hydrophilic liquid-absorbing materials are materials having a water-sorption capacity of at least one mole of water per mole of monomeric unit. Sorption capacities of various monomers are given, e.g., in Van Krevelin, D. W. and P. J. Hoftyzer, *Polymers: Correlations with Chemical Structure,* Elsevier Publishing Co., New York, N.Y. pp 294–296 (1972). Suitable liquid-absorbent materials include polymers formed from monomers such as vinyl lactams having 4–8 membered rings, alkyl tertiary amino alkyl(meth)acrylates, and alkyl quaternary amino alkyl(meth)acrylates. Alternatively, the liquid-absorbent component may be selected from commercially available water-soluble or water-swellable polymers such as polyvinyl alcohol, vinyl acetate, polyvinylacetals, gelatin, carboxymethylceluose, hydroxypropylcellulose, hydroxyethylstarch, polyethyl oxazoline, polyethylene oxide, polyethylene glycol, polypropylene oxide, and combinations thereof. Preferred polymers include polyvinyl alcohols and polyvinyl lactams, in particular, polyvinyl pyrrolidones.

The crosslinkable polymer comprises from about 25 to 99%. preferably 30 to 60% of the total SIPNs. The liquid-absorbent component comprises from about 1 to 75%, preferably from about 40 to 70% of the total SIPNs. If needed, the SIPN comprises from about 0.5 to 6.0% crosslinking agent, preferably from about 1.0 to 4.5%.

The ink-receptive composition may also include a mordant such as those described in U.S. Pat. Nos. 5,89,269 and 5,342,688, incorporated herein by reference. The term "mordant" refers to a compound which, when present in a composition, interacts with a dye to prevent diffusion through the composition. A preferred polymeric mordant comprises a guanidine functionality having the following structure.

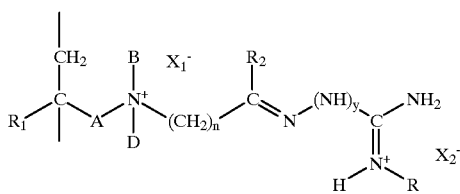

where A is selected from the group consisting of a COO—alkylene group having 1 to 5 carbon atoms, a CONH—alkylene group having 1 to 5 carbon atoms. —COO—$(CH_2CH_2O)_n$—$CH_2$— and —CONH—$(CH_2CH_2O)_n$—$CH_2$—, where n is an integer from 1 to 5; B and D are separately selected from the group consisting of alkyl group having from 1 to 5 carbon atoms; or A, B, D and N are combined to from a heterocyclic compound having the one of the following structures,

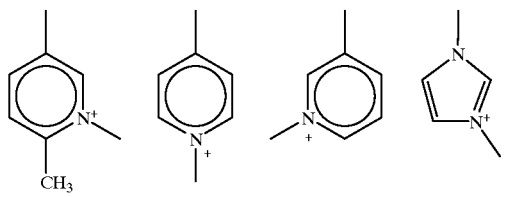

$R_1$ and $R_2$ are independently selected from the group consisting of hydrogen, phenyl, and an alkyl group containing from about 1 to 5 carbon atoms; R is selected from the group consisting of hydrogen, phenyl, benzimidazolyl, and an alkyl group containing from about 1 to 5 carbon atoms; y is 0 or 1, and $X_1$ and $X_2$ are anions.

The ink-receptive layer can also include particulate materials for the purpose of improving handling and flexibility. Preferred particulate materials include polymeric beads, e.g., poly(methylmethacrylate),poly(stearyl methacrylate) hexanedioldiacrylate copolymers, poly(tetrafluoroethylene). polyethylene; starch and silica. Poly(methylmethacrylate) beads are most preferred. Levels of particulate are limited by the requirement that the final coating be transparent with a haze level of 15% or less, as measured according to ASTM D1003-61 (Reapproved 1979). The preferred mean particle diameter for particulate material is from 5 to 40 micrometers, with at least 25% of the particles having a diameter greater than or equal to 15 micrometers. Most preferably, at least 50% of the particulate material has a diameter from 20 micrometers to 40 micrometers.

The ink-receptive layer can be applied to the temporary support by any conventional coating technique, e.g., deposition from a solution or dispersion of the resins in a solvent or aqueous medium, or blend thereof, by means of such processes as Meyer bar coating, knife coating, reverse roll coating, rotogravure coating, extrusion bar coating, etc. Once coated onto the temporary support, the ink-receptive layer may be transferred to a final receptor either prior to or after imaging.

Alternatively, a releasable thermoplastic layer may be interposed between the temporary support and the ink receptive layer. The thermoplastic layer provides additional assistance for release of the ink receptive layer from the support and also provides added protection for the transferred image composite. Preferred thermoplastics are thermally activated adhesives that are non-tacky at room temperature and typically have a Tg between 40° C. and 180° C. Suitable adhesives include acrylics, methacrylics, styrene/acrylic copolymers, styrene/butadiene copolymers, vinyl acetates, vinyl chlorides, acrylamides, and combinations thereof. The thermoplastic layer may include flexibilizers such as polyvinyl ethers and phthalate esters. In addition, the thermoplastic layer may include other additives to retard deterioration of the image after transfer to a final receptor e.g., UV absorbers, antioxidants, abrasion resistance materials, and slip agents. The thermoplastic layer may be coated out of any common solvent; however, water dispersion is preferred to reduce concerns for environmental emissions.

Once a multi-colored image is generated on the ink receptive layer of the temporary receptor, it is then laminated with heat and pressure onto a second receptor comprising a final substrate having deposited thereon an adhesive layer. This adhesive layer may be the same or different from the releasable thermoplastic layer described above. To prevent blocking in storage, the adhesive layer may include slip agents, such as silica, polymeric beads, wax, etc. The adhesive layer may be deposited onto the final substrate by coating directly onto the substrate or by laminating an adhesive layer to the surface of the substrate. The thickness of the adhesive is generally between 2 and 10 micrometers, preferably between 3 and 8 micrometers, more preferably between 4 and 6 micrometers.

A variety of materials may be used for the final substrate. Suitable materials include cloth, polymeric films, paper, glass, cardboard, metal sheeting, etc. There is no real limitation on the nature of the substrate so long as it can provide support for the image and can withstand the lamination process.

Once the image composite is laminated to the adhesive layer on the final substrate, then the temporary support is removed, thus giving rise to a final construction comprising in the following order a final substrate, an adhesive layer, a multi-colored ink-jet image deposited on or absorbed in an ink receptive layer, and an optional thermoplastic layer which may act as a protective layer. To assist in the transfer of the image composite to the adhesive layer of the final receptor, it is sometimes useful to remove a strip of the ink-receptive layer along one edge of the composite. When an thermoplastic layer is interposed between the temporary support and the ink-receptive layer, removal of the ink-receptive layer allows the thermoplastic layer and the adhesive layer to come into contact with each other thus providing a stronger bond along the edge to assist transfer.

Additional images may be added to this construction using the same process as described above. The secondary image is formed on a temporary receptor and then transferred to the top layer (ink receptive layer or thermoplastic layer) of the multi-colored image composite. Adding a secondary image using this process provides several advantages. For example, a viewer may want to initially view the multi-colored image on a designated substrate to judge color balance and aesthetics. Once an acceptable colored image is found, then the viewer can add additional images over the multi-colored image for other purposes such as, lines and dimensions for packaging specifications, or highlight colors and accents to improve design aesthetics, or printed directions for assembly, etc. If the temporary support is transparent, then the viewer can simply place the secondary image over the multi-colored image composite to view the affects before transferring the secondary image onto the multi-colored image composite. This allows the viewer to decide whether the secondary image is acceptable before permanently transferring the secondary image onto the composite thus saving time and expense.

EXAMPLES

The following preparations describe the methods for preparing the MMA polymer, mordant and final receptor referred to in the Examples.

Preparation of Methylmethacrylate copolymer:

As described in U.S. Pat. No. 5,342,688 (Examples section, Synthesis of Ink-Receptive Copolymer A), the copolymer was prepared by combining 60 parts N-vinyl-2-pyrrolidone, 20 parts hydroxyethylmethacrylate, 10 parts of the ammonium salt of acrylic acid, 10 parts methoxyethylacrylate, 0.14 part Vazo™ 64 (available from E.I. DuPont de Nemours and Company), and 500 parts deionized water in a one-liter brown bottle. After the mixture was purged with dry nitrogen gas for five minutes, polymerization was effected by immersing the bottle in a constant temperature bath maintained at a temperature of 60° C. for 24 hours. The resulting polymerized mixture was then diluted with deionized water to give a 10% solution.

Preparation of Mordant:

As described in U.S. Pat. No. 5,342,688 (Examples: Glass G Mordant Synthesis), a reaction vessel fitted with a mechanical stirrer, a condenser, and a dropping funnel was charged with 100 parts of DMAEMA (N,N-dimethylaminoethyl methacrylate). A solution of 117.1 parts of chloroacetone hydrazone-aminoguanidinium hydrochloride in 285 parts of methanol was added to the vessel slowly from the dropping funnel in such a rate that the reaction exotherm does not exceed 50° C. After completion of the addition, the reaction solution was stirred for two hours. The solvent was then removed by rotary evaporation under vacuum at about 40° C. A white solid was formed: monomer B which was characterized by its $^1$H NMR spectrum.

50 g of monomer B was then placed in a reaction vessel with 50 g of water, and 0.23 g, of V-51 (2,2'-azobis(2-amiindinopropane)di-hydrochloride (available from Wako Chemical Co.). The solution was purged for 20 minutes, then heated at 50° C. for 2 hours. A viscous polymer solution was obtained. $^1$H NMR and % solid analyses revealed polymerization to Mordant G having the following structure:

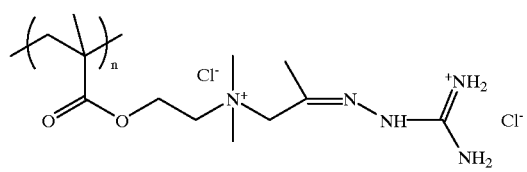

Preparation of Final Receptor:

An adhesive coating solution was prepared by mixing the following ingredients:

| Preparation of Final Receptor: | |
|---|---|
| An adhesive coating solution was prepared by mixing the following ingredients: | |
| KOH (0.16% in Water) | 46.4 kg |
| Hycar ™ 26315 Latex (49.5% T.S. acrylic polymer in water available from B. F. Goodrich, Brecksville, OH) | 40.3 kg |
| Hycar ™ 26106 Latex (49.5% T.S. acrylic polymer in water available from B. F. Goodrich, Brecksville, OH) | 10.1 kg |
| Acrysol ™ ASE-95 NP Thickening Agent (available from Rohm and Haas, Philadelphia, PA) | 0.6 kg |
| Polymethylmethacrylate beads | 0.8 kg |
| Water | 1.8 kg |

The coating solution was coated onto a 2 mil (0.051 mm) polyester substrate and dried in a heated air oven giving a dry thickness of 3.75 micrometers. The adhesive layer was laminated to a 24 point two-sided chipboard in a Matchprint™ M477 Laminator (available from Imation Corp., Oakdale, Minn.). The polyester substrate was removed leaving the adhesive layer in contact with the chipboard.

Example 1

The following ink-receptive coating was coated onto 4 mil (0.10 mm) unprimed polyester film using a knife coater set at a 5 mil (0.13 mm) gap and dried in a heated air oven.

| | |
|---|---|
| Airvol ™ 523 (polyvinyl alcohol available from Air Products & Chemicals, Allentown, PA) | 3.9 g |
| Gohsenol ™ KL-03 (polyvinyl alcohol available from Nippon Synthetic Chemical Industry, Ltd. Osaka, Japan) | 1.3 g |
| Methylmethacrylate copolymer | 35.8 g |
| Water | 50.0 g |
| Ethanol 190P (available from Ashland Chemical, Columbus, OH) | 7.2 g |
| Ammonium Hydroxide | 0.7 g |
| Class G Mordant | 0.6 g |
| Carbowax ™ Polyethylene Glycol 600 (available from Union Carbide, Danbury, CT) | 0.4 g |
| Polymethylmethacrylate beads | 0.08 g |
| Xama ™ 7 (pentaerythritol-tris-(β-(aziridinyl) propionate, available from EIT, Lake Wylie, SC) | 0.07 g |

The coated ink-jet receptor was reverse imaged in a M4700 printer (available from Imation Corp.) using IRIS Graphic Arts Ink Set ink-jet inks. The imaged side of the ink-jet receptor was placed in contact with the adhesive layer of the chipboard receptor described above and laminated in a Matchprint™ M477 Laminator. The polyester film adjacent to the ink-jet receptor coating was removed to give a right reading print on the chipboard thus simulating a printed package material.

Example 2

The following adhesive coating solution was prepared and coated onto a 2 mil (0.051 mm) unprimed polyester film at 650 mg/ft² (dry thickness of about 6.5 micrometers):

| | |
|---|---|
| Synthemul ™ R-97603 (terpolymer of N-(hydroxymethyl) acrylamide/butyl acrylate/methyl methacrylate, available from Reichhold Chemicals Inc., Dover, DE; 45% total solids in water) | 13,511 g |
| Deionized Water | 4320 g |
| Tetronic12 ™ 701 (alkoxylated amine non-ionic surfactant, available from BASF Corporation, Parsippany, NJ) | 16 g |
| 10.5 Micron Polymethylmethacrylate beads (prepared as described in U.S. Pat. No. 2,701,245) | 22 g |
| Daxad ™ 11KLS Dispersant (potassium salt of polymerized naphthalene sulfonic acid, available from W. R. Grace, Lexington, Mass.) | 1.3 g |

The adhesive coating solution described above was coated onto 2 mil (0.051 mm) polyester film using a #12 wire wound bar and dried for 2 minutes at 93° C. (200° F.). The ink-receptive coating described in Example 1 was then coated onto the adhesive layer using a knife coater set at a 5 mil (0.13 mm) gap and dried in a heated air oven.

The coated ink-jet receptor was reverse imaged in a M4700 printer. The imaged side of the ink-jet receptor was placed in contact with the adhesive layer of the chipboard receptor described above and laminated in a Matchprint™ M477 Laminator. The polyester film adjacent to the adhesive coating was removed to give a right reading print on the chipboard thus simulating a printed package material having a protective adhesive layer on the surface.

What is claimed is:

1. An image transfer method comprising the steps of:
   (a) forming an image composite by applying at least one inkjet ink in an imagewise pattern(s) on a first receptor comprising a temporary support having deposited thereon an ink receptive layer, wherein the ink receptive layer comprises a crosslinked semi-interpenetrating network formed from a blend of a crosslinkable polymer in an amount of about 25 to 99% of the total crosslinked semi-interpenetrating network and a liquid absorbent component in an amount of about 1 to 75% of the total crosslinked semi-interpenetrating network;
   (b) providing a second receptor comprising a final substrate having deposited thereon an adhesive layer;
   (c) laminating the imaged side of said image composite with heat and pressure to said adhesive layer of said second receptor; and
   (d) removing said temporary support.

2. The image transfer method of claim 1 wherein said first receptor comprises a releasable thermoplastic layer interposed between said temporary support and said ink receptive layer.

3. The image transfer method of claim 1 wherein said inkjet ink is aqueous based.

4. The image transfer method of claim 1 wherein said crosslinkable polymer is derived from copolymerization of an ethylenically unsaturated monomer with a monomer having an acidic group or hydrolysis of an ethylenically unsaturated monomer having pendant ester groups.

5. An image transfer method comprising the steps of:
   (a) forming a first image composite by applying at least one ink-jet ink in an imagewise pattern(s) on a first receptor comprising a temporary support having deposited thereon a first ink-receptive layer;
   (b) providing a second receptor comprising a final substrate having deposited thereon an adhesive layer;
   (c) laminating the imaged side of said first image composite with heat and pressure to said adhesive layer of said second receptor;
   (d) removing said temporary support;
   (e) forming a second image composite by applying at least one ink-jet ink in an imagewise pattern(s) on a third receptor comprising a second temporary support having deposited thereon a second ink-receptive layer;
   (f) laminating the imaged side of said second image composite with heat and pressure to said first ink-receptive layer; and
   (g) removing said second temporary support, wherein at least one of the first or the second ink receptive layers comprises a crosslinked semi-interpenetrating network formed from a blend of a crosslinkable polymer in an amount of about 25 to 99% of the total crosslinked semi-interpenetrating network and a liquid absorbent component in an amount of about 1 to 75% of the total crosslinked semi-interpenetrating network.

* * * * *